(12) United States Patent
Watanabe et al.

(10) Patent No.: US 11,889,767 B2
(45) Date of Patent: Jan. 30, 2024

(54) MULTILAYER PIEZOELECTRIC CERAMIC AND METHOD FOR MANUFACTURING SAME, MULTILAYER PIEZOELECTRIC ELEMENT, AS WELL AS PIEZOELECTRIC VIBRATION APPARATUS

(71) Applicant: TAIYO YUDEN CO., LTD., Tokyo (JP)

(72) Inventors: Gouki Watanabe, Takasaki (JP); Ryo Ito, Takasaki (JP); Takayuki Goto, Takasaki (JP); Hiroyuki Shimizu, Takasaki (JP); Sumiaki Kishimoto, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 536 days.

(21) Appl. No.: 16/814,804

(22) Filed: Mar. 10, 2020

(65) Prior Publication Data
US 2020/0295253 A1 Sep. 17, 2020

(30) Foreign Application Priority Data

Mar. 14, 2019 (JP) .................................. 2019-046703
Mar. 15, 2019 (JP) .................................. 2019-048177

(51) Int. Cl.
*H01L 41/187* (2006.01)
*H10N 30/853* (2023.01)
(Continued)

(52) U.S. Cl.
CPC ....... *H10N 30/8542* (2023.02); *C04B 35/495* (2013.01); *C04B 37/001* (2013.01);
(Continued)

(58) Field of Classification Search
None
See application file for complete search history.

(56) References Cited

U.S. PATENT DOCUMENTS

2004/0104644 A1* 6/2004 Yuu .................... H01L 41/0477
310/363
2008/0290316 A1 11/2008 Katayama et al.
(Continued)

FOREIGN PATENT DOCUMENTS

CN 102863214 B 6/2014
CN 109119529 A 1/2019
(Continued)

OTHER PUBLICATIONS

A First Office Action issued by the State Intellectual Property Office of China dated Jul. 1, 2022, for Chinese counterpart application No. 202010169370.3 (11 pages).
(Continued)

*Primary Examiner* — Benjamin P Sandvik
(74) *Attorney, Agent, or Firm* — Law Office of Katsuhiro Arai (57) ABSTRACT

A multilayer piezoelectric ceramic is such that: its piezoelectric ceramic layers do not contain lead as a constituent element, and have a perovskite compound expressed by the composition formula $Li_xNa_yK_{1-x-y}NbO_3$ (where $0.02<x\le0.1$, $0.02<x+y\le1$), as the primary component; and the internal electrode layers are constituted by a metal containing silver by 80 percent by mass or more, and contain ceramic grains containing the same elements found in the primary component. The multilayer piezoelectric element has a long lifespan, and whose internal electrode layers have a high content percentage of silver.

6 Claims, 6 Drawing Sheets

(51) Int. Cl.
  *C04B 35/495* (2006.01)
  *C04B 37/00* (2006.01)
  *H10N 30/20* (2023.01)
  *H10N 30/50* (2023.01)
  *H10N 30/053* (2023.01)
  *H10N 30/87* (2023.01)

(52) U.S. Cl.
  CPC ........... *H10N 30/053* (2023.02); *H10N 30/20* (2023.02); *H10N 30/50* (2023.02); *H10N 30/871* (2023.02); *H10N 30/877* (2023.02); *C04B 2235/3255* (2013.01); *C04B 2235/768* (2013.01); *C04B 2235/786* (2013.01); *C04B 2237/345* (2013.01)

(56) References Cited

U.S. PATENT DOCUMENTS

| | | | |
|---|---|---|---|
| 2009/0102325 A1* | 4/2009 | Ozawa | C01G 23/003 310/358 |
| 2013/0162109 A1 | 6/2013 | Hatano et al. | |
| 2013/0320815 A1* | 12/2013 | Hatano | H03H 9/02031 310/365 |
| 2014/0028156 A1* | 1/2014 | Shimizu | H01L 41/273 156/89.12 |
| 2015/0062257 A1 | 3/2015 | Masubuchi et al. | |
| 2016/0351789 A1* | 12/2016 | Watanabe | H01L 41/0471 |
| 2017/0263845 A1* | 9/2017 | Hatano | H01L 41/273 |
| 2018/0375010 A1 | 12/2018 | Kishimoto et al. | |

FOREIGN PATENT DOCUMENTS

| | | |
|---|---|---|
| JP | 2002164248 A | 6/2002 |
| JP | 2004146774 A | 5/2004 |
| JP | 2005244090 A | 9/2005 |
| JP | 2010180121 A | 8/2010 |
| JP | 2013014470 A | 1/2013 |
| JP | 2013237607 A | 11/2013 |
| JP | 2017163055 A | 9/2017 |
| JP | 2019009414 A | 1/2019 |
| WO | 2007094115 A1 | 8/2007 |

OTHER PUBLICATIONS

A Notice of Reasons for Refusal issued by the Japanese Patent Office, dated Dec. 22, 2022, for Japanese counterpart application No. 2019-048177. (4 pages).

A Notice of Reasons for Refusal issued by the Japanese Patent Office, dated May 25, 2023, for Japanese counterpart application No. 2019-046703. (4 pages).

* cited by examiner

MULTILAYER PIEZOELECTRIC CERAMIC AND METHOD FOR MANUFACTURING SAME, MULTILAYER PIEZOELECTRIC ELEMENT, AS WELL AS PIEZOELECTRIC VIBRATION APPARATUS

CROSS-REFERENCE TO RELATED APPLICATIONS

The present application claims priority to Japanese Patent Application No. 2019-046703, filed Mar. 14, 2019, and 2019-048177, filed Mar. 15, 2019, the disclosures of which are incorporated herein by reference in its entirety including any and all particular combinations of the features disclosed therein.

BACKGROUND

Field of the Invention

The present invention relates to a multilayer piezoelectric ceramic and a method for manufacturing the same, a multilayer piezoelectric element, as well as a piezoelectric vibration apparatus.

Description of the Related Art

Piezoelectric ceramics are widely used for sensors, actuators, etc., that utilize the properties of piezoelectric elements formed therefrom to undergo mechanical displacements and consequently generate electrical charges, or to produce mechanical displacements based on potential differences between electrodes.

For the compositions of piezoelectric ceramics that constitute piezoelectric elements, lead zirconate titanate (Pb(Zr, Tr)$O_3$, PZT) and solid solutions thereof are widely used. PZT-based piezoelectric ceramics have advantages in that their high Curie temperatures allow them to be used in high-temperature environments, and that their high electromechanical coupling coefficients permit efficient conversion of electrical energy to mechanical energy and vice versa. Also, these piezoelectric ceramics can be sintered at temperatures below 1000° C. when appropriate compositions are selected, which is another advantage because the manufacturing costs of piezoelectric elements can be reduced. In particular, multilayer piezoelectric ceramics permit the use, for the internal electrodes to be sintered simultaneously with the piezoelectric ceramics, of low-melting-point materials containing lower quantities of platinum, palladium, and other expensive materials, which results in a substantial cost reduction effect. However, PZT-based piezoelectric ceramics are viewed as problematic in that they contain lead which is a harmful substance; accordingly, there is a need for alternative piezoelectric ceramics that are lead-free.

Various types of lead-free piezoelectric ceramic compositions have been reported to date, such as those based on alkali niobate ((Li,Na,K)$NbO_3$), bismuth sodium titanate (($Bi_{0.5}Na_{0.5}$)$TiO_3$, BNT), layered bismuth compounds, tungsten bronze, and the like. Among these, alkali niobate-based piezoelectric ceramics have high Curie temperatures as well as relatively high electromechanical coupling coefficients, and are therefore drawing attention as piezoelectric ceramics to replace PZT-based counterparts (Patent Literature 1).

As for alkali niobate-based piezoelectric ceramics, use of silver-containing internal electrodes in the process of stacking piezoelectric ceramic layers alternately with internal electrodes to produce a multilayer piezoelectric ceramic, may cause this silver to diffuse into the piezoelectric ceramic and the electrical resistance to drop, thereby reducing the reliability of the piezoelectric element. In contrast, Patent Literature 2 reports having achieved a high electrical resistivity with an alkali niobate-based piezoelectric ceramic composition containing an alkali earth metal and silver, even when $Ag_{0.7}Pd_{0.3}$ internal electrodes were utilized.

BACKGROUND ART LITERATURES

[Patent Literature 1] International Patent Laid-open No. 2007/094115
[Patent Literature 2] Japanese Patent Laid-open No. 2017-163055

SUMMARY

In recent years, a growing call for reducing the costs of multilayer piezoelectric elements is necessitating the use, as internal electrodes, of an 8/2 Ag—Pd alloy using a reduced quantity of expensive Pd, as well as alloys with even higher content percentages of silver, including pure silver.

It has been the case that these multilayer piezoelectric elements having internal electrodes with high content percentages of silver may still have a short lifespan and low reliability even when the countermeasures described in Patent Literature 2 are taken.

Accordingly, an object of the present invention is to provide a multilayer piezoelectric element with a long lifespan, whose piezoelectric ceramic layers do not contain lead as a constituent element and whose internal electrode layers have a high content percentage of silver.

After conducting various studies to solve the aforementioned problems, the inventor of the present invention found that the problems could be solved by manufacturing a multilayer piezoelectric ceramic in such a way that a ceramic powder containing the same elements found in the primary components of the piezoelectric ceramic is mixed into the conductive paste for forming the internal electrodes so that ceramic grains containing the same elements found in the primary component would be contained in the internal electrode layers of the obtained multilayer piezoelectric ceramic, and eventually completed the present invention.

To be specific, a first aspect of the present invention to solve the aforementioned problems is a multilayer piezoelectric ceramic constituted by piezoelectric ceramic layers stacked alternately with internal electrode layers, wherein such multilayer piezoelectric ceramic is characterized in that: the piezoelectric ceramic layers do not contain lead as a constituent element, and have a perovskite compound expressed by the composition formula $Li_xNa_yK_{1-x-y}NbO_3$ (where $0.02<x\leq0.1$, $0.02<x+y\leq1$), as the primary component; and the internal electrode layers are constituted by a metal containing silver by 80 percent by mass or more, and contain ceramic grains containing the same elements found in the primary component.

Additionally, a second aspect of the present invention is a method for manufacturing multilayer piezoelectric ceramic constituted by piezoelectric ceramic layers stacked alternately with internal electrode layers, wherein such method for manufacturing multilayer piezoelectric ceramic is characterized in that it includes: preparing green sheets that contain a material powder whose primary component is a perovskite compound expressed by the composition formula $Li_xNa_yK_{1-x-y}NbO_3$ (where $0.02<x\leq0.1$, $0.02<x+y\leq1$) and which does not contain lead as a constituent element, and a binder; preparing a conductive paste that contains a metal powder with a silver content of 80 percent by mass or higher, a ceramic powder containing the same elements found in the primary component, and an organic vehicle; using the conductive paste to form conductor layers on the green sheets; stacking the green sheets on which the conductor layers have been formed, and then bonding the green sheets together to obtain a formed green sheet; and removing the binder from, and sintering, the formed green sheet to obtain a sintered body whose internal electrode layers contain ceramic grains containing the same elements found in the primary component.

Furthermore, a third aspect of the present invention is a multilayer piezoelectric element that includes the aforementioned multilayer piezoelectric ceramic, while a fourth aspect of the present invention is a piezoelectric vibration apparatus that includes the piezoelectric element and a vibration plate joined thereto.

According to the present invention, a multilayer piezoelectric element with a long lifespan, whose piezoelectric ceramic layers do not contain lead as a constituent element and whose internal electrode layers have a high content percentage of silver, can be provided.

DESCRIPTION OF THE SYMBOLS

100 Multilayer piezoelectric ceramic
110 Multilayer piezoelectric element
2 Piezoelectric ceramic layer
3 Internal electrode layer
31 Ceramic grain containing the same elements found in the primary component
41, 42 Connection conductor
51, 52 Surface electrode

DETAILED DESCRIPTION OF EMBODIMENTS

The constitutions as well as operations and effects of the present invention are explained below, together with the technical ideas, by referring to the drawings. It should be noted, however, that the mechanisms of operations include estimations and whether they are right or wrong does not limit the present invention in any way. Also, among the constituent components recited in any embodiments disclosed herein and associated with any aspects disclosed below, those constituent components not described in a manner representing the most generic scope/concepts are explained as optional constituent components which can constitute any embodiments representing more specific scope/concepts than the most generic scope/concepts in any one or more respects. It should be noted that a description of numerical range (description of two values connected by "to") is interpreted to include the described values as the lower limit and the upper limit.

Multilayer Piezoelectric Ceramic

Figure 1A:
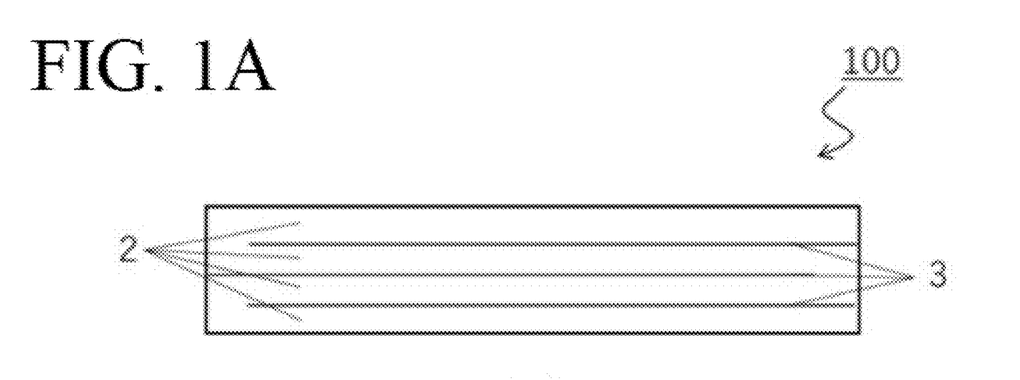
FIGS. 1A and 1B are schematic views showing the structure of a multilayer piezoelectric ceramic (1A is a front view, while 1B is a perspective view).
Figure 1B:
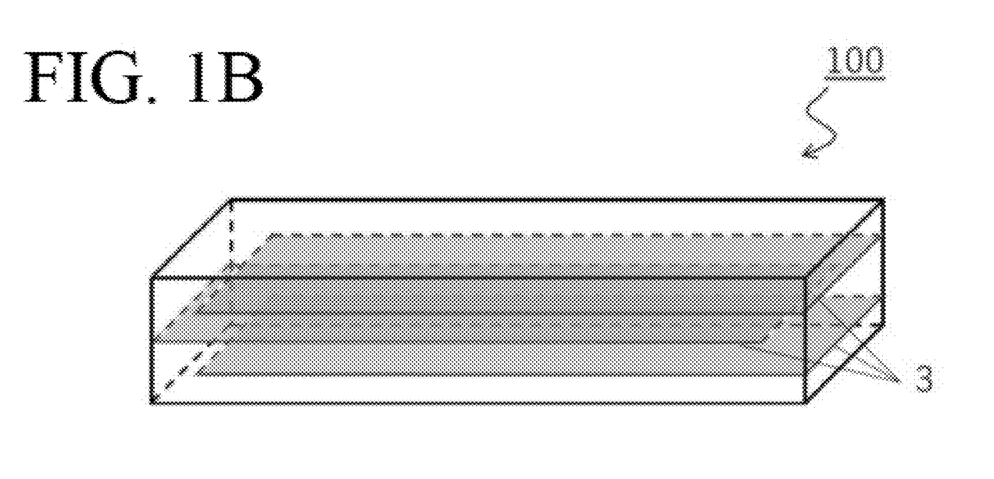

As shown schematically in FIGS. 1A and 1B, the multilayer piezoelectric ceramic 100 pertaining to the first aspect of the present invention (hereinafter also referred to simply as "first aspect") is constituted by piezoelectric ceramic layers 2 stacked alternately with internal electrode layers 3. It should be noted that, while the drawings show a structure wherein the internal electrode layers 3 are exposed on the multiple end faces of the multilayer piezoelectric ceramic 100 for easy identification of the positions of the internal electrode layers 3, the structure in the first aspect is not limited to the foregoing and a structure wherein the internal electrode layers 3 are exposed only on one end face of the multilayer piezoelectric ceramic 100, or a structure wherein the internal electrode layers 3 are not exposed on the end faces of the multilayer piezoelectric ceramic 100, is also permitted.

Also, the piezoelectric ceramic layers 2 do not contain lead as a constituent element and their primary component is a perovskite compound expressed by the composition formula $Li_xNa_yK_{1-x-y}NbO_3$ (where $0.02<x\leq0.1$, $0.02<x+y\leq1$), while the internal electrode layers 3 are constituted by a metal containing silver by 80 percent by mass or higher and also contain ceramic grains containing the same elements found in the primary component.

Because the piezoelectric ceramic layers 2 in the first aspect do not contain lead as a constituent element, burdens on the environment can be reduced. In this disclosure, " . . . does not contain lead as a constituent element" means that lead is not contained except for lead that is unavoidably contained in the material or lead that unavoidably mixes in during the manufacturing process to the extent that lead does not materially change the characteristics of the resultant piezoelectric ceramic for its intended use or application. Likewise, in this disclosure, " . . . does not contain an element M as a constituent element" means that M is not contained except for M that is unavoidably contained in the material or M that unavoidably mixes in during the manufacturing process to the extent that M does not materially change the characteristics of the resultant piezoelectric ceramic for its intended use or application. Further, in this disclosure, in some embodiments, any one or more of the disclosed elements or components as options can be exclusively selected or can expressly be excluded, depending on the target piezoelectric ceramic to be manufactured, its target properties, etc., and/or for practical reasons, operational reasons, etc.

The piezoelectric ceramic layers 2 in the first aspect have, as their primary component, a perovskite compound expressed by the composition formula $Li_xNa_yK_{1-x-y}NbO_3$ (where $0.02<x\leq0.1$, $0.02<x+y\leq1$). Here, in this Specification, the "primary component" refers to the component contained in the largest quantity in the piezoelectric ceramic layers 2 based on mass. In some embodiments, it further refers to a piezoelectric ceramic wherein the above perovskite structure is substantially maintained as if it contains no other indispensable constituent element(s).

In the composition formula, the value of x, or specifically the content percentage of Li, shall be greater than 0.02 but no greater than 0.1. By adjusting the value of x to greater than 0.02, the piezoelectric ceramic will become dense. The value of x is adjusted preferably to 0.04 or greater, or more preferably to 0.06 or greater. By adjusting the value of x to no greater than 0.1, on the other hand, the production of $Li_3NbO_4$ and other conductive compounds will be inhibited and the piezoelectric ceramic will have excellent insulating property and durability. The value of x is adjusted preferably to no greater than 0.09, or more preferably to no greater than 0.08.

In the composition formula, the value of x+y, or specifically the total sum of the content percentage of Li and the content percentage of Na being an optional component, shall be greater than 0.02 but no greater than 1. By adjusting the values of x and y to satisfy this condition, the piezoelectric ceramic will have excellent piezoelectric properties.

The piezoelectric ceramic layers 2 in the first aspect may contain other additive elements or compounds to the extent that desired properties are achieved, so long as their primary component is a perovskite compound expressed by the aforementioned composition formula. Examples of additive elements that can be contained include Sc, Ti, V, Cr, Fe, Co, Ni, Cu, Zn, Y, Mo, La, Ce, Pr, Nd, Sm, Eu, Gd, Tb, Dy, Ho, Er, Tm, Yb, Lu, Hf, W, and the like, in addition to commonly used Ta and Sb.

Here, the following method is used to confirm that the piezoelectric ceramic layers 2 in the first aspect have a perovskite compound expressed by the aforementioned composition formula as their primary component.

First, an X-ray diffraction system based on Cu-K= rays (RINT2500 Series, manufactured by Rigaku Corporation) is used to measure the diffraction line profiles of the piezoelectric ceramic layer 2 exposed at the topmost surface of the multilayer piezoelectric ceramic 100 in the stacking direction, and if a profile derived from the perovskite structure is recognized as the primary component, and also if the ratios of the strongest diffraction line intensities in the diffraction profiles that are assumed to have been derived from other structures, to the strongest diffraction line intensity in the profile derived from the perovskite structure, are 10 percent or lower, then such multilayer piezoelectric ceramic is determined to have a perovskite compound as the primary component. It should be noted that, if an electrode is formed on the topmost surface of the multilayer piezoelectric ceramic and the piezoelectric ceramic layer is not exposed, the electrode is removed by means of polishing, etc., prior to measurement.

Next, to add conductivity, carbon is vapor-deposited on the piezoelectric ceramic layers 2 of the multilayer piezoelectric ceramic 100, whose primary component has been determined as a perovskite compound, after which energy dispersive X-ray spectroscopic (EDS) measurement is performed using a silicon-drift type energy dispersive X-ray detector (Apollo, manufactured by AMETEK, Inc.) provided on a field-emission scanning electron microscope (FE-SEM: S-4300, manufactured by Hitachi High-Technologies Corporation). The measurement voltage is set to 10 kV, and K-K, Na-K, and Nb-L spectra are used for quantitative evaluation. Measurement is performed over a sufficient period of time so that the K-K spectral line intensity reaches a count of 5000 or higher. Atomic-number correction, absorption correction, and fluorescence correction (ZAF corrections) are performed on the respective spectra, to calculate the content of each element.

Lastly, a composition formula is determined by using, as the values of y and 1-x-y in the aforementioned composition formula, the content ratios of Na and K to the calculated Nb content (in percent by mol or percent by atom), respectively, and those piezoelectric ceramic layers 2 whose composition formula as determined herein falls within the ranges of the aforementioned composition formula are considered to have a perovskite compound expressed by the aforementioned composition formula as the primary component.

The piezoelectric ceramic layers 2 in the first aspect may contain 0.2 to 3.0 mol of Li relative to 100 mol of the primary component.

When Li is contained by 0.2 mol or higher relative to 100 mol of the primary component, the piezoelectric ceramic will become dense. This action becomes more prominent through a combined use of Si as described below. Additionally, improved piezoelectric properties can also be expected when Li is contained. The content of Li is adjusted preferably to 0.3 mol or higher, or more preferably to 0.5 mol or higher, relative to 100 mol of the primary component.

On the other hand, adjusting the content of Li to 3.0 mol or lower relative to 100 mol of the primary component inhibits the production of $Li_3NbO_4$ and other conductive compounds, and the piezoelectric ceramic will have excellent insulating property and durability as a result. The content of Li is adjusted preferably to 2.0 mol or lower, or more preferably to 1.5 mol or lower.

Also, the piezoelectric ceramic layers 2 in the first aspect may contain 0.2 to 5.0 mol of at least one type of alkali earth metal element selected from the group that includes Ca, Sr, and Ba, relative to 100 mol of the primary component.

When the content of these alkali earth metal elements is adjusted to 0.2 mol or higher relative to 100 mol of the primary component, the piezoelectric ceramic will have excellent piezoelectric properties and its insulating resistance will also become excellent due to a production of fine polycrystalline bodies. The content of alkali earth metal elements is adjusted preferably to 0.4 mol or higher, or more preferably to 0.5 mol or higher.

On the other hand, adjusting the content of alkali earth metal elements to 5.0 mol or lower relative to 100 mol of the primary component allows for retention of high piezoelectric performance. The content of alkali earth metal elements is adjusted preferably to 4.0 mol or lower, or more preferably to 3.0 mol or lower.

Also, the piezoelectric ceramic layers 2 in the first aspect may contain 0.2 to 2.0 mol of Mn relative to 100 mol of the primary component.

Adjusting the content of Mn to 0.2 mol or higher relative to 100 mol of the primary component improves the electrical resistance of the piezoelectric ceramic layer. The content of Mn is adjusted preferably to 0.3 mol or higher, or more preferably to 0.5 mol or higher.

On the other hand, adjusting the content of Mn to 2.0 mol or lower relative to 100 mol of the primary component allows for retention of high piezoelectric performance. The content of Mn is adjusted preferably to 1.5 mol or lower, or more preferably to 1.0 mol or lower.

Furthermore, the piezoelectric ceramic layers 2 in the first aspect may contain 0.1 to 3.0 mol of Si relative to 100 mol of the primary component.

Adjusting the content of Si to 0.1 mol or higher relative to 100 mol of the primary component makes the piezoelectric ceramic dense. This action becomes more prominent through a combined use of Li as described above. Additionally, Si also acts to produce $Li_2SiO_3$, $Li_4SiO_4$, and other compounds by reacting with excess Li, while inhibiting the production of $Li_3NbO_4$ and other conductive compounds. The content of Si is adjusted preferably to 0.5 mol or higher, or more preferably to 1.0 mol or higher.

On the other hand, adjusting the content of Si to 3.0 mol or lower relative to 100 mol of the primary component suppresses the production quantity of heterogeneous phases having no piezoelectricity, and the piezoelectric ceramic will have excellent piezoelectric properties as a result. The content of Si is adjusted preferably to 2.5 mol or lower, or more preferably to 2.0 mol or lower.

Here, the contents of the respective elements relative to the primary component are obtained by measuring the contents of Nb and the respective elements using a high-frequency inductively coupled plasma atomic emission spectrophotometer (ICP-AES) (iCAP6500, manufactured by Thermo Fisher Scientific K.K.), ion chromatographic system (ICS-1600, manufactured by Thermo Fischer Scientific K.K.) or X-ray fluorescence analyzer (XRF) (ZSX Primus-IV, manufactured by Rigaku Corporation), and then calculating the mol numbers of the respective elements relative to the content of Nb representing 100 mol, based on the content ratios of the respective elements to Nb.

In the first aspect, preferably the ratio of the maximum value of diffraction intensity ($I_{max}$) to the minimum value of diffraction intensity ($I_{min}$), or ($I_{max}/I_{min}$), at 2θ=25.5° to 26.5°, based on an X-ray diffraction measurement using Cu-Kα rays performed on the surface of the piezoelectric ceramic layer 2 positioned at the topmost surface in the stacking direction, is 8.0 or smaller. When this diffraction intensity ratio ($I_{max}/I_{min}$) is small, it means the quantity of $Li_3NbO_4$ in the piezoelectric ceramic layer 2 is small. Specifically, because the main peak in the X-ray diffraction profile of $Li_3NbO_4$ appears in the range of 2θ=25.5° to 26.5°, the maximum value of diffraction intensity ($I_{max}$) in this range corresponds to the main peak intensity of $Li_3NbO_4$. Accordingly, the fact that this intensity is sufficiently small relative to the minimum value of diffraction intensity ($I_{min}$) that corresponds to the background, is the equivalent of saying that the content of $Li_3NbO_4$ is small. Because the content of conductive $Li_3NbO_4$ is small, as described above, the piezoelectric ceramic will have superior insulating property and durability. The diffraction intensity ratio is preferably 7.5 or lower, or more preferably 7.2 or lower.

Here, the ratio of the maximum value of diffraction intensity ($I_{max}$) to the minimum value of diffraction intensity ($I_{min}$), or ($I_{max}/I_{min}$), shall be the ratio of the two that were calculated as the highest $I_{max}$ and the lowest $I_{min}$ ($I_{max}/I_{min}$), among the diffraction line intensities in the range of 2θ=25.5° to 26.5° based on a diffraction line profile measurement performed using an X-ray diffraction system based on Cu-Kα rays (RINT2500 Series, manufactured by Rigaku Corporation) on the surface of the piezoelectric ceramic layer 2 positioned at the topmost surface of the multilayer piezoelectric ceramic 100 in the stacking direction. It should be noted that, if an electrode is formed on the topmost surface of the multilayer piezoelectric ceramic 100 in the stacking direction or otherwise the piezoelectric ceramic layer 2 is not exposed, the electrode, etc., on the surface is removed by means of polishing, etc., to expose the piezoelectric ceramic layer 2 before measurement is performed.

The internal electrode layers 3 in the first aspect are constituted by a metal containing silver by 80 percent by mass or higher. By increasing the content of silver, the use quantities of palladium (Pd), platinum (Pt), and other expensive materials can be reduced and the material cost can be lowered. Also, the conductivity of the internal electrode layers can be increased. The metal to use as the electrode material may be an Ag—Pd alloy, pure silver, etc. The content of silver in the metal is adjusted preferably to 85 percent by mass or higher, or more preferably to 90 percent by mass or higher.

The internal electrode layers 3 in the first aspect contain ceramic grains containing the same elements found in the primary component.

In general, a "ceramic powder containing the same elements found in the primary component" refers to a material in powdered state which is added, when a multilayer ceramic is manufactured, to the conductive paste for forming its internal electrode layers in order to improve the adhesion between the ceramic layers and the internal electrode layers and also align their coefficients of thermal expansion. In this aspect, the ceramic layers are constituted by an alkali niobate-based piezoelectric ceramic and therefore, in this Specification, the material which is added to the conductive paste for forming the internal electrodes and which will produce an alkali niobate or a substitutional solid solution thereof when sintered, is described as a "ceramic powder containing the same elements found in the primary component," while the material containing the alkali niobate or substitutional solid solution thereof as obtained by the sintering, is described as "ceramic grains containing the same elements found in the primary component."

In the first aspect, a piezoelectric element with a long lifespan can be obtained, even when its internal electrode layers 3 are constituted by a metal with a high content percentage of silver, because ceramic grains containing the same elements found in the primary component are contained in the internal electrode layers 3.

The achievement of a long lifespan is understood as the result, in the process of obtaining the multilayer piezoelectric ceramic 100 through sintering, of the ceramic grains containing the same elements found in the primary component attracting silver in the internal electrode layers 3 to their surroundings and thereby inhibiting diffusion of silver into the piezoelectric ceramic layers 2.

Diffusion of silver into the piezoelectric ceramic layers 2 is likely to cause a drop in the insulating property of the piezoelectric ceramic layers 2, not only because silver itself has high conductivity, but also because it induces production of conductive compounds such as $Li_3NbO_4$ in the piezoelectric ceramic layers 2. And, this drop in insulating property is understood as a cause of a shorter lifespan of the multilayer piezoelectric element. In the first aspect, the presence, in the internal electrode layers 3, of ceramic grains containing the same elements found in the primary component means such drop in the insulating property of the piezoelectric ceramic layers 2 has been inhibited, which in turn indicates that a piezoelectric element with a long lifespan can be obtained even when the content percentage of silver in the internal electrode layers 3 is high.

In addition to the above, inhibiting the diffusion of silver from the internal electrode layers 3 is also beneficial from the viewpoint of ensuring conductivity of the internal electrode layers 3. Diffusion of silver from the internal electrode layers 3 to the piezoelectric ceramic layers 2 leads to a lower content percentage of silver and a reduced thickness in the internal electrode layers 3. In a piezoelectric element application, these phenomena can each cause a drop in the conductivity of the internal electrode layers 3, or an eventual rise in the electrical resistance, the result of which is an increase in the amount of heat generated from use. Accordingly, inhibiting the diffusion of silver from the internal electrode layers 3 is also effective in preventing the above.

Preferably the ceramic grains containing the same elements found in the primary component have a composition similar to that of the piezoelectric ceramic layers 2, or specifically their primary component is a perovskite compound expressed by the composition formula $Li_xNa_yK_{1-x-y}NbO_3$ (where $0.02<x\le0.1$, $0.02<x+y\le1$) or a substitutional solid solution thereof. Using a composition similar to that of the piezoelectric ceramic layers 2, for the ceramic grains containing the same elements found in the primary component, improves the joining strength between the internal electrode layers 3 and the piezoelectric ceramic layers 2 and also reduces the difference between the coefficients of thermal expansion of the two layers, thereby allowing for effective inhibition of delamination.

Figure 2:
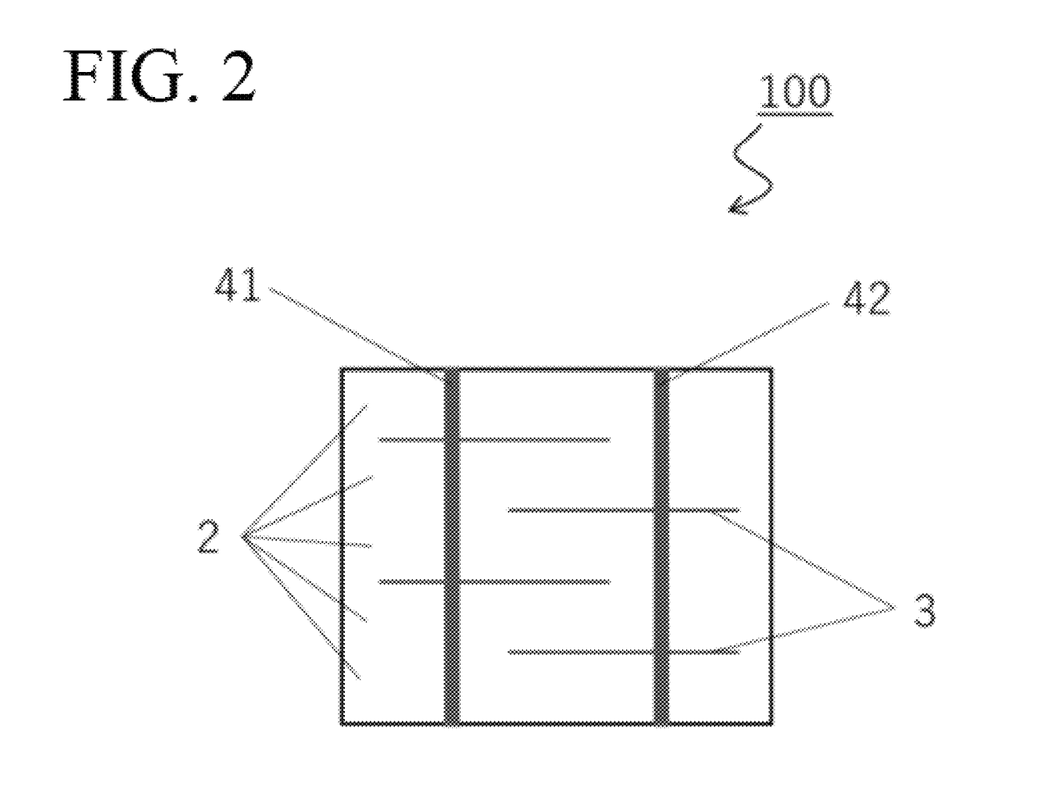
FIG. 2 is a schematic cross-sectional view showing the structure of a multilayer piezoelectric ceramic having connection conductors running through the piezoelectric ceramic layers.

In the first aspect, the multilayer piezoelectric ceramic, when it is applied to a piezoelectric element, allows connection conductors 41, 42 that each electrically connect a group of internal electrode layers 3, 3 to which a voltage of the same polarity (positive or negative) or phase is applied, to be provided through the piezoelectric ceramic layers 2, as shown schematically in FIG. 2. The connection conductors 41, 42, which are running through the piezoelectric ceramic layers 2, are placed in a manner connecting the alternate internal electrode layers 3, 3 together, as shown in FIG. 2.

If connection conductors 41, 42 are provided through the piezoelectric ceramic layers 2, preferably ceramic grains containing the same elements found in the primary component are also contained in each of the connection conductors from the viewpoint of inhibiting diffusion of silver.

Method for Manufacturing Multilayer Piezoelectric Ceramic

The method for manufacturing multilayer piezoelectric ceramic pertaining to the second aspect of the present invention (hereinafter also referred to simply as "second aspect") includes: preparing green sheets that contain a material powder whose primary component is a perovskite compound expressed by the composition formula $Li_xNa_yK_{1-x-y}NbO_3$ (where $0.02<x\le0.1$, $0.02<x+y\le1$) and which does not contain lead as a constituent element, and a binder; preparing a conductive paste that contains a metal powder with a silver content of 80 percent by mass or higher, a ceramic powder containing the same elements found in the primary component, and an organic vehicle; using the conductive paste to form conductor layers on the green sheets; stacking the green sheets on which the conductor layers have been formed, and then bonding the green sheets together to obtain a formed green sheet; and removing the binder from, and sintering, the formed green sheet to obtain a sintered body whose internal electrode layers contain ceramic grains containing the same elements found in the primary component.

The green sheets used in the second aspect contain a material powder whose primary component is a perovskite compound expressed by the composition formula $Li_xNa_yK_{1-x-y}NbO_3$ (where $0.02<x\le0.1$, $0.02<x+y\le1$), as well as a binder.

The material powder contained in the green sheets is obtained by mixing prescribed quantities of lithium compound powder, sodium compound powder, potassium compound powder, and niobium compound powder, and then calcining the powder mixture.

The lithium compound, sodium compound, potassium compound, and niobium compound to be used are not limited in composition, purity, grain size, etc., so long as they are powders that will react with one another when calcined and produce a perovskite compound expressed by the aforementioned composition formula. They may be compounds that contain two or more types of elements among Li, Na, K, and Nb, or compounds that contain other elements acting as additive elements. Examples of lithium compounds that can be used include lithium carbonate ($Li_2CO_3$), etc. Also, examples of sodium compounds that can be used include sodium carbonate ($Na_2CO_3$), sodium hydrogen carbonate ($NaHCO_3$), etc., Also, examples of potassium compounds that can be used include potassium carbonate ($K_2CO_3$), potassium hydrogen carbonate ($KHCO_3$), etc. Also, examples of niobium compounds that can be used include niobium pentoxide ($Nb_2O_5$), etc.

The method for mixing these compound powders is not limited in any way so long as the respective powders are mixed uniformly while mixing-in of impurities is prevented, and either dry mixing or wet mixing may be adopted. If wet mixing using a ball mill is adopted as the mixing method, the mixing should be performed for approx. 8 to 24 hours, for example.

The calcining conditions are not limited so long as the respective compounds will react with one another and a calcined (which may be referred to as "tentatively sintered") powder will be obtained whose primary component is a perovskite compound expressed by the aforementioned composition formula, and should be 2 to 8 hours at 700 to 1000° C. in the air, for example. If the calcining temperature is too low or the calcining period is too short, there are concerns that unreacted materials or intermediate products may remain. If the calcining temperature is too high or the calcining period is too long, on the other hand, there are concerns that the alkali components will volatilize and a compound of the desired composition may not be obtained, or generated substances will agglomerate and become harder to disintegrate, thus causing productivity to drop.

In the second aspect, the material powder may contain at least one type of compound selected from lithium compounds, calcium compounds, strontium compounds, barium compounds, manganese compounds, and silicon compounds. Preferably when the material powder contains a lithium compound, the quantity of Li is 0.2 to 3.0 mol relative to 100 mol of the primary component, and when the material powder contains at least one type of alkali earth metal compound selected from calcium compounds, strontium compounds, and barium compounds, the total quantity of alkali earth metal element(s) is 0.2 to 5.0 mol relative to 100 mol of the primary component, and when the material powder contains a manganese compound, the quantity of Mn is 0.2 to 2.0 mol relative to 100 mol of the primary component, and when the material powder contains a silicon compound, the quantity of Si is 0.1 to 3.0 mol relative to 100 mol of the primary component, respectively.

These compounds are not limited in composition, purity, grain size, etc., so long as piezoelectric ceramic layers of the desired composition can be formed in the sintered body to be finally obtained. They may be compounds that contain two or more types of elements among Li, Ca, Sr, Ba, Mn, and Si, or compounds that contain other elements acting as additive elements. Examples of lithium compounds that can be used include lithium carbonate ($Li_2CO_3$), lithium metasilicate ($Li_2SiO_3$), lithium orthosilicate ($Li_4SiO_4$), etc. Also, examples of calcium compounds that can be used include calcium carbonate ($CaCO_3$), calcium metasilicate ($CaSiO_3$), calcium orthosilicate ($Ca_2SiO_4$), etc. Also, examples of strontium compounds that can be used include strontium carbonate ($SrCO_3$), etc. Also, examples of barium compounds that can be used include barium carbonate ($BaCO_3$), etc. Also, examples of manganese compounds that can be used include manganese carbonate ($MnCO_3$), manganese monoxide (MnO), manganese dioxide ($MnO_2$), trimanganese tetraoxide ($Mn_3O_4$), manganese acetate (Mn($OCOCH_3$)$_2$), etc. Also, examples of silicon compounds that can be used include silicon dioxide ($SiO_2$), lithium metasilicate ($Li_2SiO_3$), lithium orthosilicate ($Li_4SiO_4$), calcium metasilicate ($CaSiO_3$), calcium orthosilicate ($Ca_2SiO_4$), etc.

These compounds are mixed into the aforementioned calcined powder according to a method that can provide a uniform material powder while preventing mixing-in of impurities. For the mixing method, either dry mixing or wet mixing may be adopted. Also, mixing may double as a way to crush the calcined powder. If wet mixing using a ball mill is adopted as the mixing method, mixing should be performed for approx. 8 to 24 hours, for example. Furthermore, these compounds may be added and mixed to/with the material powder together with the binder when the below-mentioned forming composition is obtained.

In the second aspect, the binder contained in the green sheets is not limited in type so long as it can form the material powder into a desired shape and retain the shape and will also volatilize, as a result of the below-mentioned sintering or the preceding binder removal process, without causing carbon, etc., to remain. Examples of binders that can be used include those based on polyvinyl alcohols, polyvinyl butyrals, celluloses, urethanes, vinyl acetates, and the like.

The binder is not limited in use quantity in any way, either, but since it will be removed in a subsequent step, preferably the use quantity is minimized to the extent that the desired formability and shape retainability can be obtained, from the viewpoint of reducing the material cost.

The green sheets used in the second aspect are manufactured by forming into sheet shape the forming composition obtained by mixing the material powder and binder.

Various types of additives may be mixed into the forming composition besides the forming powder and binder, such as a plasticizer for improving the formability and, if the forming composition is in slurry state, a dispersant for uniformly dispersing the forming powder.

For the sheet forming method, the doctor blade method, extrusion method, or any other commonly used method may be adopted.

It should be noted that, when manufacturing a multilayer piezoelectric ceramic having connection conductors running through the piezoelectric ceramic layers as described above, the obtained green sheets are punched, irradiated with a laser beam, or otherwise processed to have penetration holes (also referred to as through holes and vias) formed in them, to be filled with the connection conductors.

The conductive paste used in the second aspect contains a metal powder with a silver content of 80 percent by mass or higher, a ceramic powder containing the same elements found in the primary component, and an organic vehicle.

The metal powder with a silver content of 80 percent by mass or higher which is contained in the conductive paste may be an Ag—Pd alloy powder, a mixed powder of Ag and Pd powders, a pure silver powder, or the like.

In the second aspect, the conductive paste contains a ceramic powder containing the same elements found in the primary component, and therefore diffusion of silver from the conductor layers formed with the paste can be inhibited. Accordingly, the insulating property of the piezoelectric ceramic layers in the obtained multilayer piezoelectric ceramic can be retained, and a multilayer piezoelectric element with a long lifespan can be obtained as a result.

Preferably the ceramic powder has the same composition as that of the material powder in the green sheets as described above, because this can suppress the generation, as a result of a compositional difference between the two powders, of diffusion fluxes that move from the conductor layers or internal electrode layers produced therefrom, toward the green sheets or piezoelectric ceramic layers produced therefrom, and thereby prevent silver from being transported by the fluxes.

The grain size of the ceramic powder is not limited in any way, but preferably its average grain size is adjusted to 1 μm or smaller.

Adjusting the average grain size to 1 μm or smaller inhibits poor contact, in the obtained multilayer piezoelectric ceramic, between the metal parts inside the internal electrode layers and the piezoelectric ceramic layers, and consequently when it is applied to a multilayer piezoelectric element, voltage can be applied to the entire piezoelectric ceramic layers. In this respect, the average grain size is adjusted more preferably to 0.8 μm or smaller, or yet more preferably to 0.6 μm or smaller.

The lower limit of average grain size is adjusted preferably to approx. 0.005 μm, or more preferably to approx. 0.01 μm, from the viewpoint of ease of availability and preparation.

Preferably the content of the ceramic powder in the conductive paste is adjusted to 5 to 15 parts by mass relative to 100 parts by mass of the metal powder.

By adjusting the content of the ceramic powder to 5 parts by mass or higher relative to 100 parts by mass of the metal powder, the aforementioned silver diffusion inhibition effect during sintering can be increased. In this respect, more preferably the content of the ceramic powder is adjusted to 7 parts by mass or higher.

On the other hand, by adjusting the content of the ceramic powder relative to the metal powder to 15 parts by mass or lower, any drop in the conductivity of the internal electrode layers can be kept to a minimum. In this respect, more preferably the content of the ceramic powder is adjusted to 12 parts by mass or lower.

The conductive paste used in the second aspect contains an organic vehicle comprising a binder dissolved in an organic solvent.

The binder used in the organic vehicle is not limited in any way, and may be selected as deemed appropriate from among the various commonly used binders such as ethyl celluloses, polyvinyl butyrals, and acrylics.

Also, the organic solvent used in the organic vehicle is not limited in any way so long as it causes minimal swelling of the aforementioned green sheets when conductor layers are formed on the green sheets using the conductive paste, and may be selected as deemed appropriate from among terpineol, butyl carbitol, acetone, toluene, MEK (methyl ethyl ketones), etc.

The content of the organic vehicle in the conductive paste is not limited in any way and, for example, the binder may be contained by approx. 5 to 10 percent by mass and the organic solvent, by approx. 10 to 50 percent by mass.

Also, the conductive paste may contain, as necessary, various dispersants and plasticizers, as well as glass frit, etc., for improving the adhesive strength to the piezoelectric ceramic layers after sintering.

For the preparation of the conductive paste, a method of kneading a mixture of the aforementioned components using a triple-roll mill, mortar machine, planetary ball mill, etc., may be adopted. Also, the conductive paste may be prepared by adding and mixing the aforementioned ceramic powder containing the same elements found in the primary component to/with a commercially available conductive paste and then kneading the mixture.

In the second aspect, conductor layers are formed on the green sheets described above using the aforementioned conductive paste.

For the forming of conductor layers, any commonly used method may be adopted. Among others, a method of printing or applying the conductive paste is preferred in terms of cost.

It should be noted that, when manufacturing a multilayer piezoelectric ceramic having connection conductors running through the piezoelectric ceramic layers as described above, an electrode material that will become connection conductors after sintering is filled, either before or after the forming of conductor layers, in the penetration holes that have been formed in the green sheets. Although the filling method is not limited in any way, a method of printing a paste that contains an electrode material is preferred in terms of cost.

In the second aspect, the green sheets on which the conductor layers have been formed are stacked, and then the green sheets are bonded together, to obtain a formed green sheet.

The stacking and bonding may be performed using any commonly used methods. Among others, a method of thermally compressing the green sheets together using the action of the binder is preferred in terms of cost.

In the second aspect, the binder is removed from the formed green sheet which is then sintered, to obtain a sintered body.

The binder removal and sintering conditions may be set as deemed appropriate by considering the volatilization temperature and content of the binder, as well as the sintering property of the piezoelectric ceramic composition, durability of the internal electrode material, and the like. Examples of sintering conditions include 1 to 5 hours at 850 to 1100° C. in the air. When obtaining multiple multilayer piezoelectric ceramics from one formed green sheet, the formed green sheet may be divided into several blocks prior to sintering.

Multilayer Piezoelectric Element

The multilayer piezoelectric ceramic pertaining to the first aspect, or the multilayer piezoelectric ceramic obtained in the second aspect, will become the multilayer piezoelectric element pertaining to the third aspect (hereinafter also referred to simply as "third aspect") when electrodes are formed on its surface and then polarized. The third aspect is explained below by referring to FIGS. 3A and 3B.

Figure 3A:
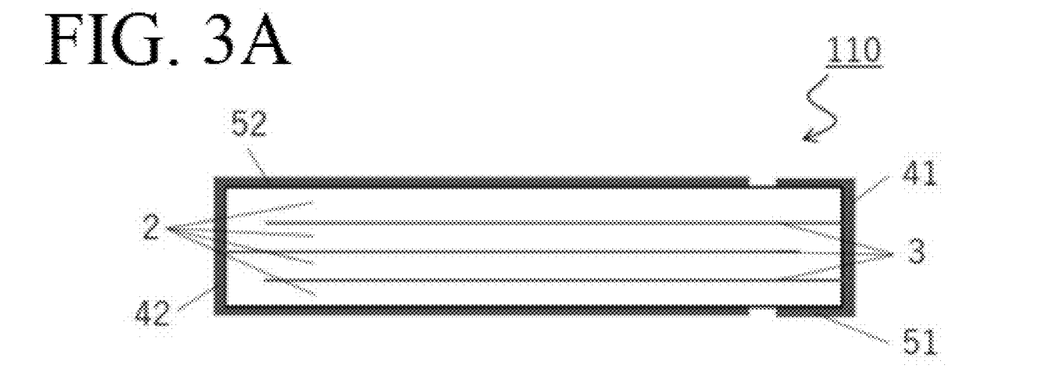
FIGS. 3A and 3B are schematic views showing the structure of a multilayer piezoelectric element (3A is a front view, while 3B is a perspective view).
Figure 3B:
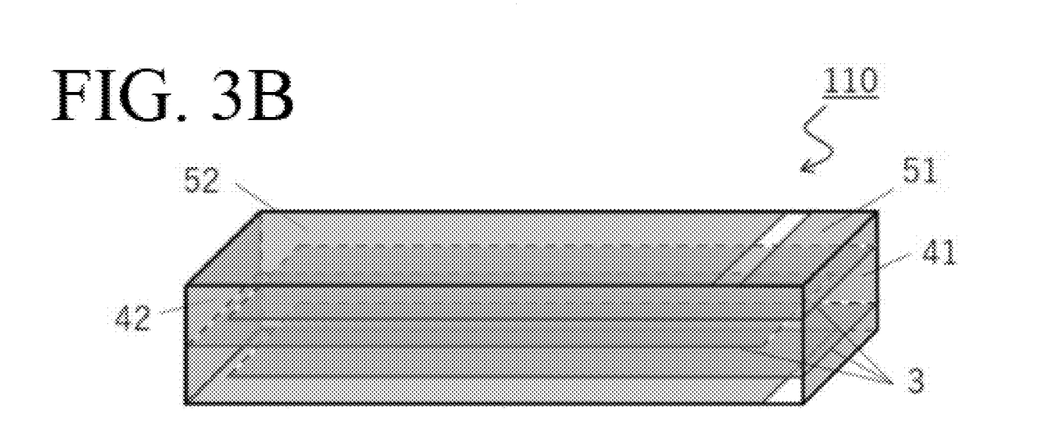

The multilayer piezoelectric element 110 pertaining to the third aspect is constituted by the multilayer piezoelectric ceramic 100 and surface electrodes 51, 52 formed on its surface. If the multilayer piezoelectric ceramic 100 is such that the connection conductors 41, 42 for electrically connecting the internal electrode layers 3, 3 together, are not running through the piezoelectric ceramic layers 2, the multilayer piezoelectric element 110 is structured so that the connection conductors 41, 42 are also provided on the surface, as shown in FIGS. 3A and 3B. The connection conductors 41, 42 are connected to the alternate internal electrode layers 3. To be specific, the connection conductor 41 is connected electrically to the odd-numbered internal electrode layers 3 as counted from the top, while the connection conductor 42 is connected electrically to the even-numbered internal electrode layers 3 as counted from the top. It should be noted that these electrical connections may be made by swapping the odd-numbered positions and the even-numbered positions. The surface electrodes 51, 52 are each connected electrically to one of the connection conductors 41, 42 and function, together with the internal electrode layers 3 connected electrically thereto, to apply voltage to the piezoelectric ceramic layers 2. It should be noted that, if the aforementioned connection conductors 41, 42 are provided on the surface of the multilayer piezoelectric element 110, the connection conductors 41, 42 may be constituted to double as the surface electrodes 51, 52.

For the forming of the surface electrodes 51, 52 and connection conductors 41, 42, any commonly used method, such as a method of applying or printing a paste containing an electrode material on the surface of the multilayer piezoelectric ceramic 100 and then baking the paste, or a method of vapor-depositing an electrode material on the surface of the multilayer piezoelectric ceramic 100, may be adopted. The electrode material is not limited in any way so long as it is highly conductive and also physically and chemically stable in the use environment of the piezoelectric element. Examples of electrode materials that can be used include silver (Ag), copper (Cu), gold (Au), platinum (Pt), palladium (Pd), nickel (Ni), alloys thereof, and the like. The electrode material with which to constitute the surface electrodes 51, 52 and connection conductors 41, 42 may be the same as, or different from, the electrode material with which to constitute the internal electrode layers 3.

The polarization conditions are not limited in any way so long as the orientations of spontaneous polarizations in the piezoelectric ceramic layers 2 can be aligned without causing cracks or other damage to the multilayer piezoelectric ceramic 100. As an example, an electric field of 1 to 5 kV/mm may be applied at a temperature of 50 to 200° C.

Piezoelectric Vibration Apparatus

The piezoelectric element pertaining to the third aspect is used favorably in a piezoelectric vibration apparatus. Accordingly, a vibration apparatus using the piezoelectric element is explained as a fourth aspect of the present invention.

The vibration device pertaining to the fourth aspect operates by applying electrical signals to and thereby vibrating the piezoelectric element, and causing a vibration plate to vibrate as a result.

The material for the vibration plate to be used is not limited in any way so long as it will vibrate as a result of the piezoelectric element vibrating, and, for example, polycarbonate, acrylic, or other resin, SUS, brass, or other metal, or glass may be used. Also, the dimensions and shape of the vibration plate are not limited in any way, either, and, for example, a rectangular plate, polygonal plate, circular plate, or oval plate of 10 to 500 μm in thickness may be utilized.

The means for joining the piezoelectric element to the vibration plate is not limited in any way so long as the vibration of the piezoelectric element can be transmitted efficiently to the vibration plate, and an adhesive using an epoxy resin, etc., or double-sided tape, and the like may be utilized.

EXAMPLES

The present invention is explained more specifically below using examples; it should be noted, however, that the present invention is not limited to these examples.

Example 1

Manufacturing of Green Sheets

As starting materials, high-purity lithium carbonate ($Li_2CO_3$), sodium carbonate ($Na_2CO_3$), potassium carbonate ($K_2CO_3$), and niobium pentoxide ($Nb_2O_5$) in powdered state were used.

These starting materials were weighed so that the calcined powder to be obtained would have a composition formula of $Li_{0.06}Na_{0.52}NbO_3$, and then wet-mixed in a ball mill.

The mixed slurry was dried, and the resulting mixed powder was calcined under the conditions of 3 hours at 900° C. in the air, to obtain a calcined powder.

To the obtained calcined powder, high-purity lithium carbonate ($Li_2CO_3$), barium carbonate ($BaCO_3$), manganese carbonate ($MnCO_3$), and silicon dioxide ($SiO_2$) were added by quantities that would give 1.3 mol of Li, 0.5 mol of Ba, 0.5 mol of Mn, and 1.3 mol of Si, relative to 100 mol of $Li_{0.06}Na_{0.52}K_{0.42}NbO_3$, to obtain a material powder.

A polyvinyl butyral binder was mixed into the obtained material powder, to obtain a forming composition.

Using the doctor blade method, the obtained forming composition was formed into green sheets of 40 μm in thickness.

Preparation of Conductive Paste

The aforementioned material powder whose average grain size had been adjusted to 0.1 μm was added and mixed to/with an Ag—Pd alloy paste (Ag/Pd ratio=9/1) so that it would account for 10 percent by mass relative to the alloy powder in the paste, after which the mixture was kneaded using a triple-roll mill, to obtain a conductive paste.

Manufacturing of Multilayer Piezoelectric Ceramic

The prepared conductive paste was screen-printed on the obtained green sheets to form conductor layers of prescribed shapes, after which the green sheets were stacked and pressure-bonded together under heating, to obtain a formed green sheet.

The obtained formed green sheet was put through a binder removal process in the air, and then sintered for 2 hours at 1000° C. in the air, to obtain a multilayer piezoelectric ceramic. It should be noted that the multilayer piezoelectric ceramic has a structure wherein the internal electrode layers are exposed alternately on a pair of opposing end faces running parallel to the stacking direction.

Figure 4:
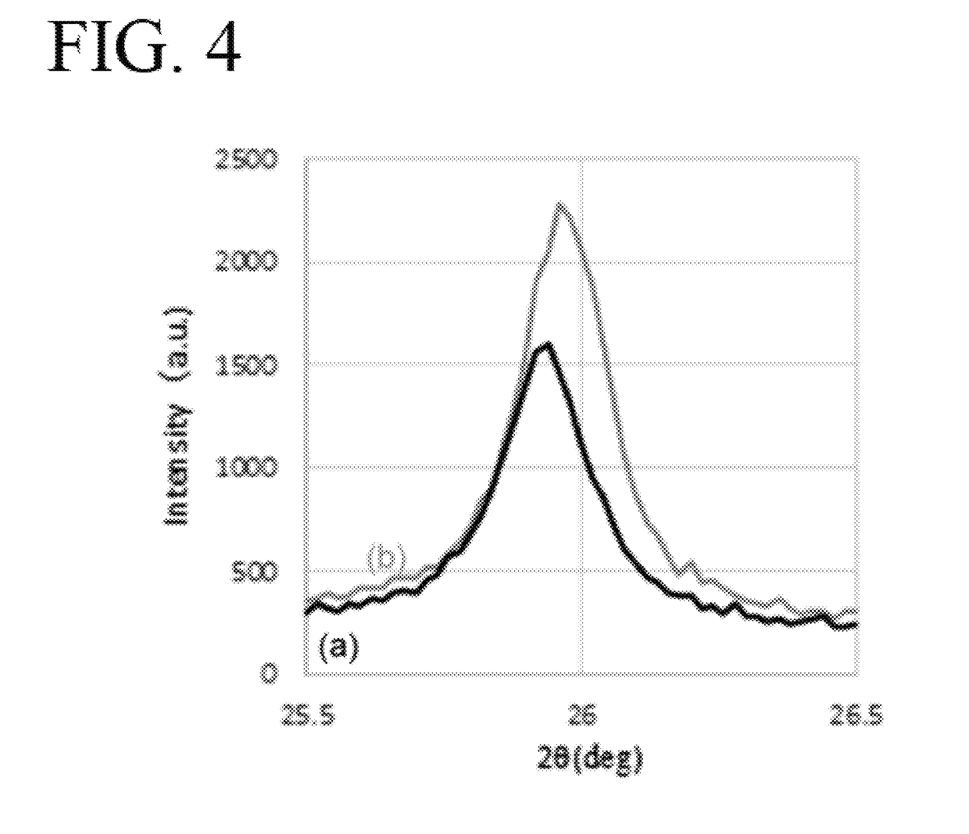
FIG. 4 is X-ray diffraction measurement results on the surfaces of the piezoelectric ceramic layers, positioned at the topmost surface in the stacking direction, of the multilayer piezoelectric ceramics pertaining to Example 1 and Comparative Example 1 ((a) represents Example 1, while (b) represents Comparative Example 1).

Measurement of X-Ray Diffraction Intensity Ratio of Multilayer Piezoelectric Ceramic When X-ray diffraction measurement was performed, according to the method described above, on the obtained multilayer piezoelectric ceramic by targeting the piezoelectric ceramic layer positioned at the topmost surface in the stacking direction, the result denoted by (a) in FIG. 4 was obtained. When, based on this result, the ratio of the maximum value of diffraction line intensity ($I_{max}$) to the minimum value of diffraction line intensity ($I_{min}$), or ($I_{max}/I_{min}$), was calculated in the range of 2θ=25.5° to 26.5° according to the method described above, $I_{max}/I_{min}$ was 6.8.

Observation of Surface and Cross-Section of Multilayer Piezoelectric Ceramic

Figure 5:
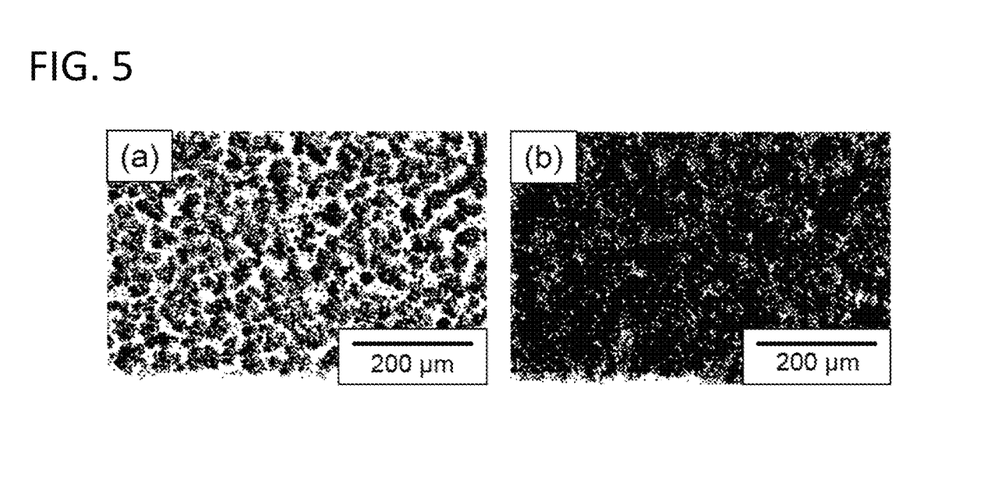
FIG. 5 is scanning electron microscope (SEM) observation results on the surfaces of the piezoelectric ceramic layers, positioned at the topmost surface in the stacking direction, of the multilayer piezoelectric ceramics pertaining to Example 1 and Comparative Example 1 ((a) represents Example 1, while (b) represents Comparative Example 1).

When platinum was vapor-deposited on the obtained multilayer piezoelectric ceramic, or specifically on the surface of the piezoelectric ceramic layer positioned at the topmost surface in the stacking direction, and then the surface was observed using a scanning electron microscope (SEM) (S-4300, manufactured by Hitachi High-Technologies Corporation), the result shown in FIG. 5A was obtained.

Figure 6:
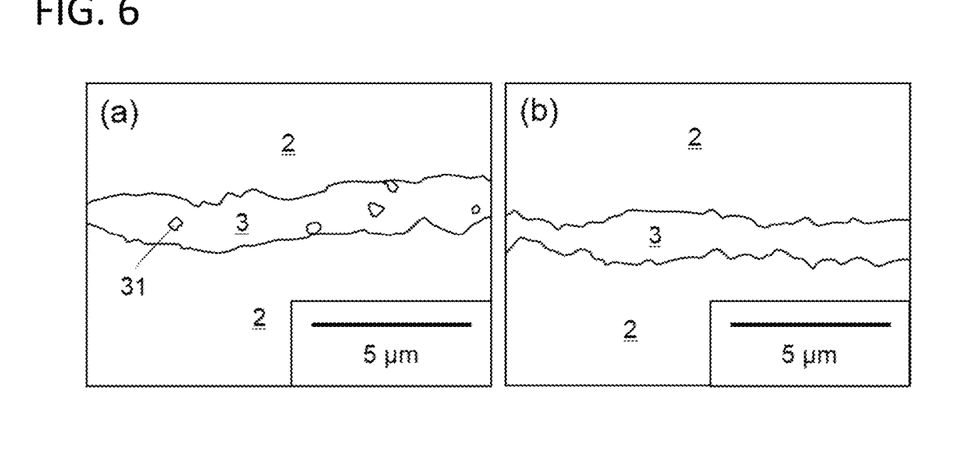
FIG. 6 is schematic views showing the scanning electron microscope (SEM) observation results on cross-sections, running parallel to the stacking direction, of the multilayer piezoelectric ceramics pertaining to Example 1 and Comparative Example 1 ((a) represents Example 1, while (b) represents Comparative Example 1).

Also, when the obtained multilayer piezoelectric ceramic was cut through a plane parallel to the stacking direction and the cut plane was observed with a SEM in the same manner as the surface, the result illustrated schematically in FIG. 6A was obtained.

Manufacturing of Multilayer Piezoelectric Element

A silver (Ag) paste was applied on the end faces on which the internal electrodes are exposed, as well as on the topmost surface in the stacking direction, of the obtained multilayer piezoelectric ceramic, and then baked by passing the multilayer piezoelectric ceramic through a belt furnace, to form connection conductors and surface electrodes, respectively.

The multilayer piezoelectric ceramic on which the electrodes had been formed, was polarized for 15 minutes at an electric field strength of 3 kV/mm in a thermostatic chamber kept at 100° C., to obtain a multilayer piezoelectric element.

Piezoelectric Constant Measurement of Multilayer Piezoelectric Element

Figure 7:
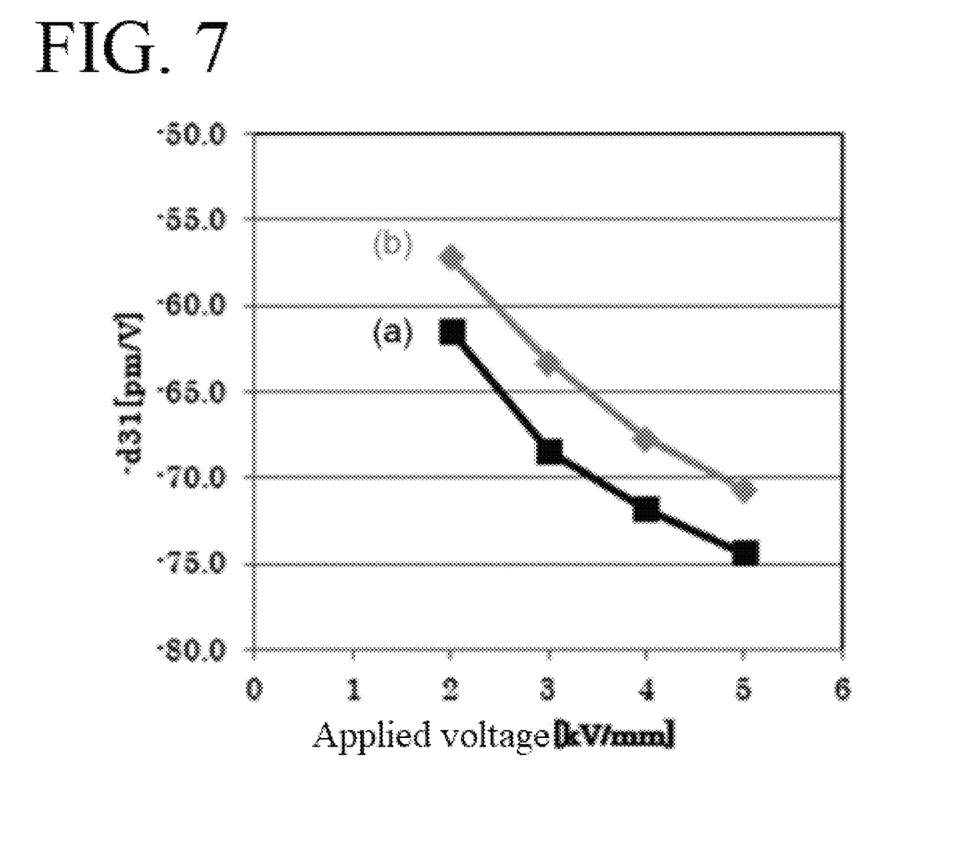
FIG. 7 is a graph showing the piezoelectric constant $d_{31}$ vs. applied voltage relationships of the multilayer piezoelectric elements pertaining to Example 1 and Comparative Example 1 ((a) represents Example 1, while (b) represents Comparative Example 1).

The value of piezoelectric constant $d_{31}$ was measured/calculated for the obtained multilayer piezoelectric element. As for the measurement, the displacement, in the longitudinal direction, of the multilayer piezoelectric element being driven at 2 to 5 kV/mm and 10 Hz was measured using a laser displacement gauge (TF Analyzer 2000, manufactured by aixACCT Systems), and the piezoelectric constant $d_{31}$ was calculated from the obtained displacement and the driving voltage. The relationship between the obtained $d_{31}$ and the applied voltage is shown in FIG. 7 as (a).

HALT Test of Multilayer Piezoelectric Element

HALT test was conducted on the obtained multilayer piezoelectric element. In the HALT test, voltage of 5 kV/mm was applied in an environment of 85° C., and how long it took for the value of current to exceed 1 mA was measured as the lifespan of the sample.

Figure 8:
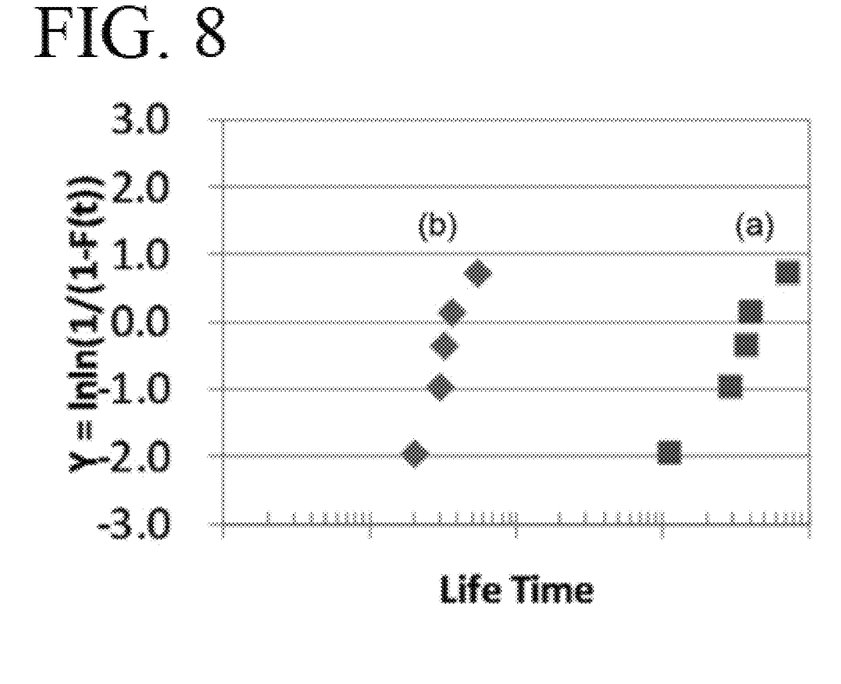
FIG. 8 is HALT test results on the multilayer piezoelectric elements pertaining to Example 1 and Comparative Example 1 ((a) represents Example 1, while (b) represents Comparative Example 1).

The obtained result is shown in FIG. 8 as (a).

Comparative Example 1

Manufacturing of Multilayer Piezoelectric Ceramic and Measurement of its X-Ray Diffraction Intensity Ratio The multilayer piezoelectric ceramic pertaining to Comparative Example 1 was obtained in the same manner as in Example 1, except that, as the conductive paste, one that does not contain a ceramic powder containing the same elements found in the primary component was used.

When X-ray diffraction measurement was performed, according to the same method in Example 1, on the obtained multilayer piezoelectric ceramic by targeting the piezoelectric ceramic layer positioned at the topmost surface in the stacking direction, the result denoted by (b) in FIG. 4 was obtained. When, based on this result, the ratio of the maximum value of diffraction line intensity ($I_{max}$) to the minimum value of diffraction line intensity ($I_{min}$), or ($I_{max}/I_{min}$), was calculated in the range of $2\theta=25.5°$ to $26.5°$ according to the same method in Example 1, $I_{max}/I_{min}$ was 8.5.

From FIG. 4, clearly the multilayer piezoelectric ceramic (a) pertaining to Example 1 in which an electrode paste that contains a ceramic powder containing the same elements found in the primary component was used, produced a smaller diffraction peak positioned at $2\theta=25.5°$ to $26.5°$ as obtained by the X-ray diffraction measurement on the topmost surface, compared to the multilayer piezoelectric ceramic (b) pertaining to Comparative Example 1 in which such electrode paste was not used. Since this diffraction peak corresponds to the main peak of $Li_3NbO_4$, it is confirmed that, in Example 1, the production of $Li_3NbO_4$ was inhibited at the topmost surface of the multilayer piezoelectric ceramic.

Observation of Surface and Cross-Section of Multilayer Piezoelectric Ceramic

When the surface and cross-section of the obtained multilayer piezoelectric ceramic were observed according to the same methods in Example 1, the results shown in FIG. 5B and FIG. 6B were obtained, respectively.

From FIG. 5, clearly light-colored and dark-colored areas (spots) are observed on the topmost surface of the multilayer piezoelectric ceramic (a) pertaining to Example 1 in which an electrode paste that contains a ceramic powder containing the same elements found in the primary component was used; whereas, the multilayer piezoelectric ceramic (b) pertaining to Comparative Example 1 in which such electrode paste was not used has its top surface almost entirely covered with dark-colored areas (spots).

A consideration of this result, together with the X-ray diffraction measurement result shown in FIG. 4, leads to an understanding that the dark-colored areas observed on the topmost surface are $Li_3NbO_4$.

Also, from FIG. 6, with the multilayer piezoelectric ceramic (a) pertaining to Example 1 in which an electrode paste that contains a ceramic powder containing the same elements found in the primary component was used, clearly the ceramic grains 31 are observed in the internal electrode layer 3; whereas, with the multilayer piezoelectric ceramic (b) pertaining to Comparative Example 1 in which such electrode paste was not used, the ceramic grains are not observed.

Furthermore, when the thickness of the internal electrode layer 3 is given focus in FIG. 6, clearly the internal electrode layer 3 is thicker in Example 1 than in Comparative Example 1.

From these results, it is understood that, in the multilayer piezoelectric ceramic pertaining to Example 1, the ceramic powder containing the same elements found in the primary component or ceramic grains produced therefrom, as contained in the electrode paste, attracted silver to or kept silver at its surroundings during sintering, thereby suppressing the diffusion of silver from the conductor layers or internal electrode layers produced therefrom, to the green sheets or piezoelectric ceramic layers produced therefrom.

Manufacturing of Multilayer Piezoelectric Element, and Piezoelectric Constant Measurement and HALT Test Thereof A multilayer piezoelectric element was manufactured from the obtained multilayer piezoelectric ceramic according to the same procedure in Example 1.

When the piezoelectric constant $d_{31}$ of the obtained multilayer piezoelectric element was measured/calculated according to the same methods in Example 1, the result denoted by (b) in FIG. 7 was obtained.

Also, HALT test was conducted on the obtained multilayer piezoelectric element according to the same method in Example 1. The obtained result is denoted by (b) in FIG. 8.

From FIG. 7, clearly the multilayer piezoelectric ceramic element (a) pertaining to Example 1 in which an electrode paste that contains a ceramic powder containing the same elements found in the primary component was used, resulted in a greater value (absolute value) of piezoelectric constant $d_{31}$ compared to the multilayer piezoelectric ceramic element (b) pertaining to Comparative Example 1 in which such electrode paste was not used. From this result, it is confirmed that adding the ceramic powder to the electrode paste would contribute to improved piezoelectric properties (displacement amount) of the multilayer piezoelectric element.

From FIG. 8, clearly the multilayer piezoelectric ceramic element (a) pertaining to Example 1 in which an electrode paste that contains a ceramic powder containing the same elements found in the primary component was used, had a lifespan approx. 100 times longer than that of the multilayer piezoelectric ceramic element (b) pertaining to Comparative Example 1 in which such electrode paste was not used.

A consideration of this result, together with the X-ray diffraction measurement result shown in FIG. 4 and the cross-section observation result shown in FIG. 6, leads to an understanding that, in Example 1, the action of the ceramic powder containing the same elements found in the primary component, in the electrode paste, suppressed diffusion of silver during sintering and thereby reduced the quantity of $Li_3NbO_4$ produced in the piezoelectric ceramic layers, and consequently the element lifespan extended significantly compared to Comparative Example 1.

Example 2

Manufacturing of Multilayer Piezoelectric Ceramic and Measurement of its X-Ray Diffraction Intensity Ratio The multilayer piezoelectric ceramic pertaining to Example 2 was obtained in the same manner as in Example 1, except that the sintering temperature was changed to 980° C.

When X-ray diffraction measurement was performed, according to the same method in Example 1, on the obtained multilayer piezoelectric ceramic by targeting the piezoelectric ceramic layer positioned at the topmost surface in the stacking direction, a peak was observed in the range of $2\theta=25.5°$ to $26.5°$, just like in Example 1. When, based on this result, the ratio of the maximum value of diffraction line intensity ($I_{max}$) to the minimum value of diffraction line intensity ($I_{min}$), or ($I_{max}/I_{min}$), was calculated in the range of $2\theta=25.5°$ to $26.5°$ according to the same method in Example 1, $I_{max}/I_{min}$ was 5.5.

Manufacturing of Multilayer Piezoelectric Element and HALT Test Thereof

From the obtained multilayer piezoelectric ceramic, the multilayer piezoelectric element pertaining to Example 2 was obtained according to the same procedure in Example 1.

When HALT test was conducted on the obtained multilayer piezoelectric element according to the same method in Example 1, a result similar to that in Example 1 was obtained.

Comparative Example 2

Manufacturing of Multilayer Piezoelectric Ceramic and Measurement of its X-ray Diffraction Intensity Ratio The multilayer piezoelectric ceramic pertaining to Comparative Example 2 was obtained in the same manner as in Example 2, except that, as the conductive paste, one that does not contain a ceramic powder containing the same elements found in the primary component was used.

When X-ray diffraction measurement was performed, according to the same method in Example 1, on the obtained multilayer piezoelectric ceramic by targeting the piezoelectric ceramic layer positioned at the topmost surface in the stacking direction, a peak was observed in the range of $2\theta=25.5°$ to $26.5°$, just like in Comparative Example 1. When, based on this result, the ratio of the maximum value of diffraction line intensity ($I_{max}$) to the minimum value of diffraction line intensity ($I_{min}$), or ($I_{max}/I_{min}$), was calculated in the range of $2\theta=25.5°$ to $26.5°$ according to the same method in Example 1, $I_{max}/I_{min}$ was 6.5.

When Example 2 and Comparative Example 2 are compared, clearly the multilayer piezoelectric ceramic pertaining to Example 2 in which an electrode paste that contains a ceramic powder containing the same elements found in the primary component was used, produced a smaller diffraction peak positioned at $2\theta=25.5°$ to $26.5°$ as obtained by the X-ray diffraction measurement on the topmost surface, compared to the multilayer piezoelectric ceramic pertaining to Comparative Example 2 in which such electrode paste was not used. Since this diffraction peak corresponds to the main peak of $Li_3NbO_4$, it is confirmed that, in Example 2, the production of $Li_3NbO_4$ was inhibited at the topmost surface of the multilayer piezoelectric ceramic.

Manufacturing of Multilayer Piezoelectric Element and HALT Test Thereof

From the obtained multilayer piezoelectric ceramic, the multilayer piezoelectric element pertaining to Comparative Example 2 was obtained according to the same procedure in Example 1.

When HALT test was conducted on the obtained multilayer piezoelectric element according to the same method in Example 1, a result similar to that in Comparative Example 1 was obtained.

Example 3

Manufacturing of Multilayer Piezoelectric Ceramic and Measurement of its X-Ray Diffraction Intensity Ratio The multilayer piezoelectric ceramic pertaining to Example 3 was obtained in the same manner as in Example 1, except that the sintering temperature was changed to 1020° C.

When X-ray diffraction measurement was performed, according to the same method in Example 1, on the obtained multilayer piezoelectric ceramic by targeting the piezoelectric ceramic layer positioned at the topmost surface in the stacking direction, a peak was observed in the range of $2\theta=25.5°$ to $26.5°$, just like in Example 1. When, based on this result, the ratio of the maximum value of diffraction line intensity ($I_{max}$) to the minimum value of diffraction line intensity ($I_{min}$), or ($I_{max}/I_{min}$), was calculated in the range of $2\theta=25.5°$ to $26.5°$ according to the same method in Example 1, $I_{max}/I_{min}$ was 7.2.

Manufacturing of Multilayer Piezoelectric Element and HALT Test Thereof

From the obtained multilayer piezoelectric ceramic, the multilayer piezoelectric element pertaining to Example 3 was obtained according to the same procedure in Example 1.

When HALT test was conducted on the obtained multilayer piezoelectric element according to the same method in Example 1, a result similar to that in Example 1 was obtained.

Comparative Example 3

The multilayer piezoelectric ceramic pertaining to Comparative Example 3 was obtained in the same manner as in Example 3, except that, as the conductive paste, one that does not contain a ceramic powder containing the same elements found in the primary component was used.

When X-ray diffraction measurement was performed, according to the same method in Example 1, on the obtained multilayer piezoelectric ceramic by targeting the piezoelectric ceramic layer positioned at the topmost surface in the stacking direction, a peak was observed in the range of $2\theta=25.5°$ to $26.5°$, just like in Comparative Example 1. When, based on this result, the ratio of the maximum value of diffraction line intensity ($I_{max}$) to the minimum value of diffraction line intensity ($I_{min}$), or ($I_{max}/I_{min}$), was calculated in the range of $2\theta=25.5°$ to $26.5°$ according to the same method in Example 1, $I_{max}/I_{min}$ was 9.2.

When Example 3 and Comparative Example 3 are compared, clearly the multilayer piezoelectric ceramic pertaining to Example 3 in which an electrode paste that contains a ceramic powder containing the same elements found in the primary component was used, produced a smaller diffraction peak positioned at $2\theta=25.5°$ to $26.5°$ as obtained by the X-ray diffraction measurement on the topmost surface, compared to the multilayer piezoelectric ceramic pertaining to Comparative Example 3 in which such electrode paste was not used. Since this diffraction peak corresponds to the main peak of $Li_3NbO_4$, it is conformed that, in Example 3, the production of $Li_3NbO_4$ was inhibited at the topmost surface of the multilayer piezoelectric ceramic.

Manufacturing of Multilayer Piezoelectric Element and HALT Test Thereof

From the obtained multilayer piezoelectric ceramic, the multilayer piezoelectric element pertaining to Comparative Example 3 was obtained according to the same procedure in Example 1.

When HALT test was conducted on the obtained multilayer piezoelectric element according to the same method in Example 1, a result similar to that in Comparative Example 1 was obtained.

Based on the above, it is conformed that, when manufacturing an alkali niobate-based multilayer piezoelectric ceramic, through the use of a conductive paste that contains a ceramic powder containing the same elements found in the primary component of the piezoelectric ceramic so that the obtained multilayer piezoelectric ceramic will contain, in its internal electrode layers, ceramic grains containing the same elements found in the primary component, a piezoelectric element with a long lifespan can be obtained even when the internal electrode layers are constituted by a metal with a high content ratio of silver. Additionally, it is conformed that use of a conductive paste that contains a ceramic powder containing the same elements found in the primary component, and the resulting internal electrode layers that contain ceramic grains containing the same elements found in the primary component, also contribute to improved piezoelectric properties of the multilayer piezoelectric element.

INDUSTRIAL APPLICABILITY

According to the present invention, a multilayer piezoelectric element with a long lifespan, whose piezoelectric ceramic layers do not contain lead as a constituent element, and whose internal electrode layers have a high content percentage of silver, can be provided. Since increasing the content percentage of silver in the internal electrode layers of the multilayer piezoelectric element can reduce the use quantity of palladium and other expensive metals, the material cost of the element can be reduced, and the present invention is useful in this respect. Also, internal electrode layers with a high content percentage of silver have low resistivity and excellent conductivity, which are also preferable because resistive heat generation is suppressed when the multilayer piezoelectric element is used (driven) and the element will demonstrate high performance as a result. A long lifespan of the multilayer piezoelectric element pertaining to the present invention is attributable to a small quantity of silver that has diffused from the internal electrode layers to the piezoelectric ceramic layers in the multilayer piezoelectric ceramic constituting the element. The small diffused quantity of silver to the piezoelectric ceramic layers also contributes to improved properties resulting from improved sintering property of the piezoelectric ceramic layers, and also to improved element performance resulting from improved conductivity of the internal electrode layers, besides extending the lifespan of the element. Accordingly, the present invention is also useful in that it can enhance the performance of multilayer piezoelectric elements and various piezoelectric vibration apparatus that use these elements.

We claim:

1. A multilayer piezoelectric ceramic constituted by piezoelectric ceramic layers stacked alternately with internal electrode layers, wherein:
    the piezoelectric ceramic layers do not contain lead as a constituent element, and have a perovskite compound expressed by a composition formula $Li_xNa_yK_{1-x-y}NbO_3$ (where $0.02<x\leq 0.1$, $0.02<x+y\leq 1$), as a primary component; and
    the internal electrode layers are constituted by a metal containing silver by 80 percent by mass or more, and contain ceramic grains containing same elements found in the primary component,
    wherein the piezoelectric ceramic layers contain, with respect to 100 mol of the primary component:
    0.2 to 3.0 mol of Li;
    0.2 to 5.0 mol of at least one type of alkali earth metal element selected from a group that includes Ca, Sr, and Ba;
    0.2 to 2.0 mol of Mn; and
    0.1 to 3.0 mol of Si,
    wherein a ratio of a maximum value of diffraction intensity ($I_{max}$) to a minimum value of diffraction intensity ($I_{min}$), or ($I_{max}/I_{min}$), at $2\theta=25.5°$ to $26.5°$ is 5.5 or greater but 8.0 or smaller as measured by an X-ray diffraction measurement using Cu-Kα rays performed on a surface of the piezoelectric ceramic layer positioned at the topmost surface in a stacking direction, wherein there is a peak of diffraction intensity at $2\theta=25.5°$ to $26.5°$, and the peak corresponds to the maximum value ($I_{max}$).

2. The multilayer piezoelectric ceramic according to claim 1, wherein the ceramic grains have a composition similar to that of the piezoelectric ceramic layers.

3. The multilayer piezoelectric ceramic according to claim 1, wherein the metal constituting the internal electrode layers contains silver by 90 percent by mass or more.

4. The multilayer piezoelectric ceramic according to claim 1, wherein the maximum value of diffraction intensity ($I_{max}$) corresponds to a main peak intensity of $Li_3NbO_4$.

5. A multilayer piezoelectric element comprising:
    a multilayer piezoelectric ceramic constituted by piezoelectric ceramic layers stacked alternately with internal electrode layers;
    a pair of connection conductors connected electrically to the alternate internal electrode layers; and
    surface electrodes provided on a surface of the multilayer piezoelectric ceramic and connected electrically to the pair of connection conductors, respectively;
    wherein the multilayer piezoelectric ceramic is the multilayer piezoelectric ceramic of claim 1.

6. A piezoelectric vibration apparatus that includes the multilayer piezoelectric element of claim 5 and a vibration plate joined to the piezoelectric element.

* * * * *